United States Patent [19]

Komori et al.

[11] Patent Number: 5,141,882
[45] Date of Patent: Aug. 25, 1992

[54] SEMICONDUCTOR FIELD EFFECT DEVICE HAVING CHANNEL STOP AND CHANNEL REGION FORMED IN A WELL AND MANUFACTURING METHOD THEREFOR

[75] Inventors: Shigeki Komori; Katsuhiro Tsukamoto, both of Hyogo, Japan

[73] Assignee: Mitsubishi Denki Kabushiki Kaisha, Tokyo, Japan

[21] Appl. No.: 816,546

[22] Filed: Dec. 30, 1991

Related U.S. Application Data

[63] Continuation of Ser. No. 461,594, Jan. 5, 1990, abandoned.

[30] Foreign Application Priority Data

Apr. 5, 1989 [JP] Japan ............................... 1-85957

[51] Int. Cl.$^5$ .......................................... H01L 21/266
[52] U.S. Cl. .......................................... 437/34; 437/45
[58] Field of Search .................................. 437/45

[56] References Cited

U.S. PATENT DOCUMENTS

| 4,710,477 | 12/1987 | Chen | 437/34 |
|---|---|---|---|
| 4,717,683 | 1/1988 | Parrillo et al. | 437/34 |
| 4,784,968 | 11/1988 | Komori et al. | 437/56 |
| 4,968,639 | 11/1990 | Bergonzoni | 437/150 |

FOREIGN PATENT DOCUMENTS

| 0026867 | 2/1987 | Japan | 437/27 |
|---|---|---|---|
| 62-235781 | 10/1987 | Japan . | |
| 63-192268 | 8/1988 | Japan . | |

OTHER PUBLICATIONS

Wolf, "Silicon Processing for the VLSI Era", vol. 1, Lattice Press, 1986, pp. 280-295 and 325-327.
A. Lewis et al., "Latchup Performance of Retrograde & Conventional n-Well CMOS Technologies", IEEE Transactions on Electron Devices, vol. ED-34, No. 10 (Oct. 1987), pp. 2156-2163.
A. Stolmeijer, "A Twin-Well CMOS Process Employing High-Energy Ion Implantation", IEEE Transactions on Electron Devices, vol. ED-33, No. 4 (Apr. 1986), pp. 450-457.
"VLSI Technology" excerpt edited by S. M. Sze, McGra-Hill International Book Co.

*Primary Examiner*—Olik Chaudhuri
*Assistant Examiner*—Ourmazd S. Ojan
*Attorney, Agent, or Firm*—Lowe, Price, LeBlanc & Becker

[57] ABSTRACT

A method of forming a well on a semiconductor substrate and a transistor on the main surface of this well. A mask exposing a region for the well is formed on the main surface of the semiconductor substrate. Subsequently, ions of impurities for forming the well are implanted on the main surface of the region for the well of the semiconductor substrate using this mask with high energy giving concentration distribution of impurities which becomes maximum at a place deeper than a region for a transistor. Subsequently, ions of impurities of the same conductivity type as that of ions for forming the well are implanted on the main surface of the region for the well of the semiconductor substrate using the mask with low energy giving concentration distribution of impurities in which impurities stay in the region for the channel of the transistor. According to this method, since the formation of the well and channel ion implantation are performed using the same mask, the number of photolithography processes is decreased. In addition, in forming the well, since it is not necessary to diffuse the impurity ions by heat, manufacturing time can be shortened. In addition, since ions of impurities are implanted in the channel region of the transistor, a punch through of the transistor can be prevented.

7 Claims, 14 Drawing Sheets

SEMICONDUCTOR FIELD EFFECT DEVICE HAVING CHANNEL STOP AND CHANNEL REGION FORMED IN A WELL AND MANUFACTURING METHOD THEREFOR

This application is a continuation of application Ser. No. 07/461,594, filed Jan. 5, 1990, now abandoned.

BACKGROUND OF THE INVENTION

1. Field of the Invention

The present invention generally relates to a method of manufacturing a semiconductor field effect device, and more particularly, to a method of manufacturing a semiconductor device having both a channel stop and channel impurity regions formed in a well, wherein the number of masking steps is minimized. The invention further relates to a semiconductor device formed thereby.

2. Description of the Background Art

A typical example of a semiconductor device in which a well is formed on a semiconductor substrate and a transistor is formed on the main surface of the well is a complimentary MOS transistor (hereinafter referred to as a CMOS transistor). The CMOS transistor is characterized in that an n channel MOS transistor and a p channel MOS transistor exist together. An advantage of the CMOS transistor is that power consumption is extremely small because a DC voltage between the power supply terminals is very small.

Meanwhile, an important step during the processing of a CMOS structure is a well forming technique. In order to make an NMOS and a PMOS on the same semiconductor substrate, regions for each of elements should be isolated. More specifically, a P well region for an N channel element and an N well region for a P channel element should be provided.

Referring to drawings, a description is given of a conventional technique of forming a well.

FIGS. 9A to 9T are sectional views of a conventional CMOS transistor showing its manufacturing steps.

Referring to FIG. 9A, an oxide film 2 and a nitride film 3 are sequentially formed on a semiconductor substrate 1 (for example a silicon substrate). Then, a resist 4 is applied to the whole surface of the semiconductor substrate 1.

Referring to FIG. 9B, the resist 4 is patterned so as to expose the portion in which the N well is to be formed. The nitride film 3 is patterned using this patterned resist 4 as a mask. Then, impurities for forming the N well, for example phosphorus are implanted using the patterned resist 4 as a mask. Thereafter, the resist 4 is removed.

Referring to FIG. 9C, a thick isolation oxide film 2a is selectively formed on a portion of the semiconductor substrate 1 using the nitride film 3 as a mask. Thereafter, the nitride film 3 is removed.

Referring to FIG. 9D, impurities for forming the P well, for example boron are implanted to the whole surface. Then, referring to FIG. 9E, heat treatment (6~8 hours) for diffusing the impurities for forming the well deeply is performed. Thereafter, referring to FIG. 9F, the isolation oxide film 2a is removed and the semiconductor substrate 1 on which an N well 5 and P well 6 were formed is obtained.

Referring to FIG. 9G, an oxide film 7, a nitride film 8 and a resist 9 are sequentially formed on the main surface of the semiconductor substrate 1. Then, referring to FIG. 9H, in order to define an active region, the resist 9 is patterned by photolithography such that the pattern resist 9 may remain on the upper portion of the active region. Thereafter, the nitride film 8 is patterned using the patterned resist 9 as a mask. Then, a resist is formed (not shown) on the whole surface of the semiconductor substrate 1 comprising the patterned resist 9.

Then, referring to FIG. 9I, the resist 10 is patterned such that the pattern of the resist 10 may remain on the N well region 5. Thereafter, boron ions which are the same as that forming the P well 6 are implanted in a non-active region to form an isolation portion 11. The reason why boron is implanted in the non-active region is that, although a thick isolation oxide film is formed at the non-active region for forming the active region in the next step, impurity boron forming the P well is absorbed in the isolation oxide film, so that the concentration of boron at the non-active region becomes low. When the concentration of boron becomes low, a phenomenon called a latch-up is generated. When the latch-up occurs, the N channel element will not be isolated. The latch-up phenomenon is described in detail in an article "VLSI TECHNOLOGY"(S. M. Sze, McGraw Hill International Book Company). Therefore, the isolation process in which boron is implanted in the non-active region to form the isolation portions 11 is necessary. After the isolation process, the patterns of the resists 9 and 10 are removed.

Referring to FIG. 9J, heat oxidation is carried out using the pattern of the nitride film 8 as a mask to form a thick isolation oxide film 7a at the non-active region. Thereafter, the nitride film 8 is removed to obtain the semiconductor substrate 1 on which the active region is defined.

Referring to FIG. 9K, a pattern of the resist 12 is formed by photolithography on the N well region 5. Thereafter, ions of boron are implanted in a channel region 13 of an MOS transistor to be formed on the P well 6. The purpose of the ion implantation into the channel region 13 is to optimize a threshold voltage of the MOS transistor and to prevent a punch through. The punch through means that a depletion layer of a drain extends to the channel portion as the voltage of the drain is raised and is finally connected to the source region, with the result that a current cannot be controlled by the gate voltage. Thereafter, the pattern of the resist 12 is removed.

Referring to FIG. 9L, the pattern of the resist 14 is formed on the P well region 6 by photolithography. Thereafter, ions of boron and arsenic are implanted in the channel region 15 of the MOS transistor to be formed in the N well 5 using the pattern of the resist 14 as a mask. Boron is thus used to balance the threshold voltages both of the respective transistors formed on the P well 6 and the N well 5.

Then, referring to FIG. 9M, the pattern of the resist 14 is removed. Referring to FIG. 9N, a thin oxide film 7b formed on the active region is removed.

Referring to FIG. 9O, gate oxide films 50 are formed on the main surfaces of the wells 5 and 6. Thereafter, a polysilicon layer 16 serving as a gate electrode is formed on the whole surface of the semiconductor substrate 1 comprising the gate oxide films 50.

Then, referring to FIG. 9P, the polysilicon layer 16 is patterned to form a gate electrode 17 on the N well 5 and a gate electrode 18 on the P well 6.

Referring to FIG. 9Q, the P well 6 is covered with the pattern of the resist 19 and ions of boron is implanted in the N well 5 using the patter of the resist 19 as a mask. As a result, source/drain regions 20 are formed in the N well 5 and a p channel MOSFET is formed. Then, the pattern of the resist 19 is removed.

Referring to FIG. 9R, the N well 5 is covered with the pattern of the resist 21 and ions of arsenic are implanted in the P well 6 using this pattern of the resist 21 as a mask. As a result, source/drain regions 22 are formed in the P well 6 and an n channel MOSFET is formed. Thereafter, the pattern of the resist 21 is removed.

Then, referring to FIG. 9S, an insulating film 23 comprising $SiO_2$ is formed on the whole surface of the semiconductor substrate 1 comprising the gate electrodes 17 and 18.

Referring to FIG. 9T, a contact hole 39 is provided in the insulating film 23 and wiring is carried out with an aluminum metal 24, with the result that a CMOSFET is completed.

The conventional manufacturing method of the CMOSFET is thus structured. However, there was a disadvantage as follows.

That is, in the conventional example shown in FIGS. 9A to 9T, referring to FIG. 9E, heat treatment for a long time of 6~8 hours was necessary for diffusing the impurity ions (for forming the well) into the semiconductor substrate 1. In addition, in this conventional example, referring to FIGS. 9B, 9H, 9I, 9K and 9L, five photolithography processes were necessary before the state shown in FIG. 9N was implemented.

FIG. 10 shows another conventional example of a method of manufacturing the CMOSFET disclosed in Japanese Patent Laying-Open Gazette No. 63-192268. In this conventional example, referring to FIG. 10, there is disclosed a technique of forming a well region 26 on the semiconductor substrate 1 by implanting ions of impurities for forming a well ($B^+$ ions) in the semiconductor substrate 1. In addition, according to the conventional example, the well region 26 and a channel stopper region 25 are formed at the same time by using a mask 27 of a specific configuration.

In the conventional example shown in FIG. 6, since impurities are not implanted in the channel region, there is a disadvantage that punch through of the transistor formed as described is generated. In addition, it was difficult to form a mask 27 having such shape as shown in the figure.

SUMMARY OF THE INVENTION

An object of the present invention is to improve a method of manufacturing a semiconductor device, which forms a transistor in a well region such that a punch through of the transistor may not be generated.

Another object of the present invention is to improve a method of manufacturing a semiconductor device, which forms a transistor on a well region such that a punch through of the transistor may not be generated and to reduce the number of manufacturing processes necessary for the manufacture.

A further object of the present invention is to improve a method of manufacturing a semiconductor device, which forms a transistor in a well region such that a punch through of the transistor may not be generated and to reduce manufacturing time.

Still another object of the present invention is to reduce the number of photolithography processes necessary for manufacture by performing ion implantation for preventing the formation of the well region and a punch through using the same resist mask, in a method of forming a transistor in the well region.

A still further object of the present invention is to improve a method of manufacturing a complementary field effect transistor such that a punch through of the transistor may not be generated.

A still further object of the present invention is to improve a method of manufacturing a complementary field effect transistor such that a punch through of the transistor may not be generated and to reduce manufacturing processes necessary for the manufacture.

A still further object of the present invention is to improve a method of manufacturing a complementary field effect transistor such that a punch through of the transistor may not be generated and to control latch-up of the transistor.

A still further object of the present invention is to provide a semiconductor device, which forms a transistor in a well region such that a punch through of the transistor may not be generated.

The present invention relates to a method of manufacturing the semiconductor device, which forms a well on a semiconductor substrate and a transistor on the main surface of the well. According to the method, first, a mask exposing a region for a well is formed on the main surface of the semiconductor substrate. Then, impurity ions for forming the well are implanted on the main surface of the region for the well on the semiconductor substrate using the above mask with high energy giving such concentration distribution of impurities that becomes maximum at the place deeper than the region for the transistor.

Then, ions of impurities of the same conductivity type as that for the well are implanted with low energy concentration distribution of impurities in which impurities stay at the region for the channel of the transistor.

According to the present invention, since the formation of the well and the channel ion implantation are performed using the same mask, the number of photolithography processes is reduced.

Since ions of impurities for forming the well are implanted on the main surface of the region for the well of the semiconductor substrate with high energy giving concentration distribution of impurities which becomes maximum at the place deeper than the region for the transistor when the well is formed, it is not necessary to thermally diffuse the impurities. Therefore, time for forming the well is shortened.

In addition, since ions of impurities of the same conductivity type as that for forming the well are implanted in the channel region also, the punch through of the transistor can be prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, a description is given of drawings of an embodiment of the present invention.

Figure 1A:
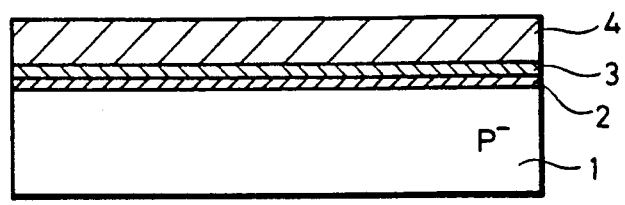
FIGS. 1A to 1G are sectional views showing steps in accordance with one embodiment of the present invention.

Referring to FIG. 1A, an oxide film 2, a nitride film 3 and a resist 4 are sequentially formed on a semiconductor substrate 1 (for example p− silicon substrate).

Figure 1B:
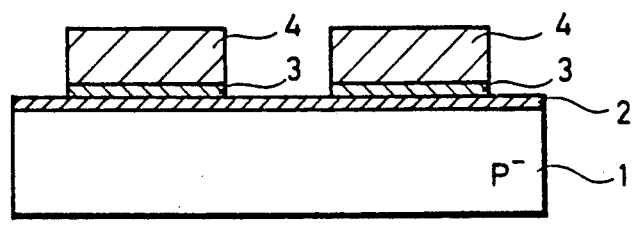

Then, referring to FIG. 1B, the resist 4 is patterned by photolithography so as to leave the pattern of the resist 4 on an active region in order to define the active region. Then, the nitride film 3 is patterned using the pattern of the resist 4. Thereafter, the pattern of the resist 4 is removed.

Figure 1C:
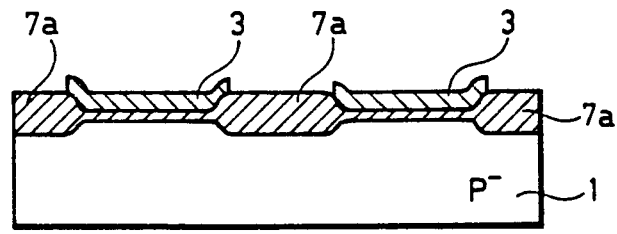

Referring to FIG. 1C, a thick isolation oxide film 7a is selectively formed on a part of the semiconductor substrate 1 using the patterned nitride film 3 as a mask. The film thickness of the isolation oxide film 7a is approximately 5000 Å. Thereafter, the nitride film 3 is removed.

Figure 1D:
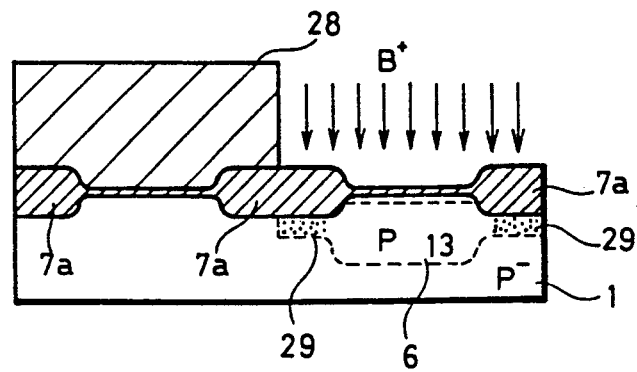
Figure 5:
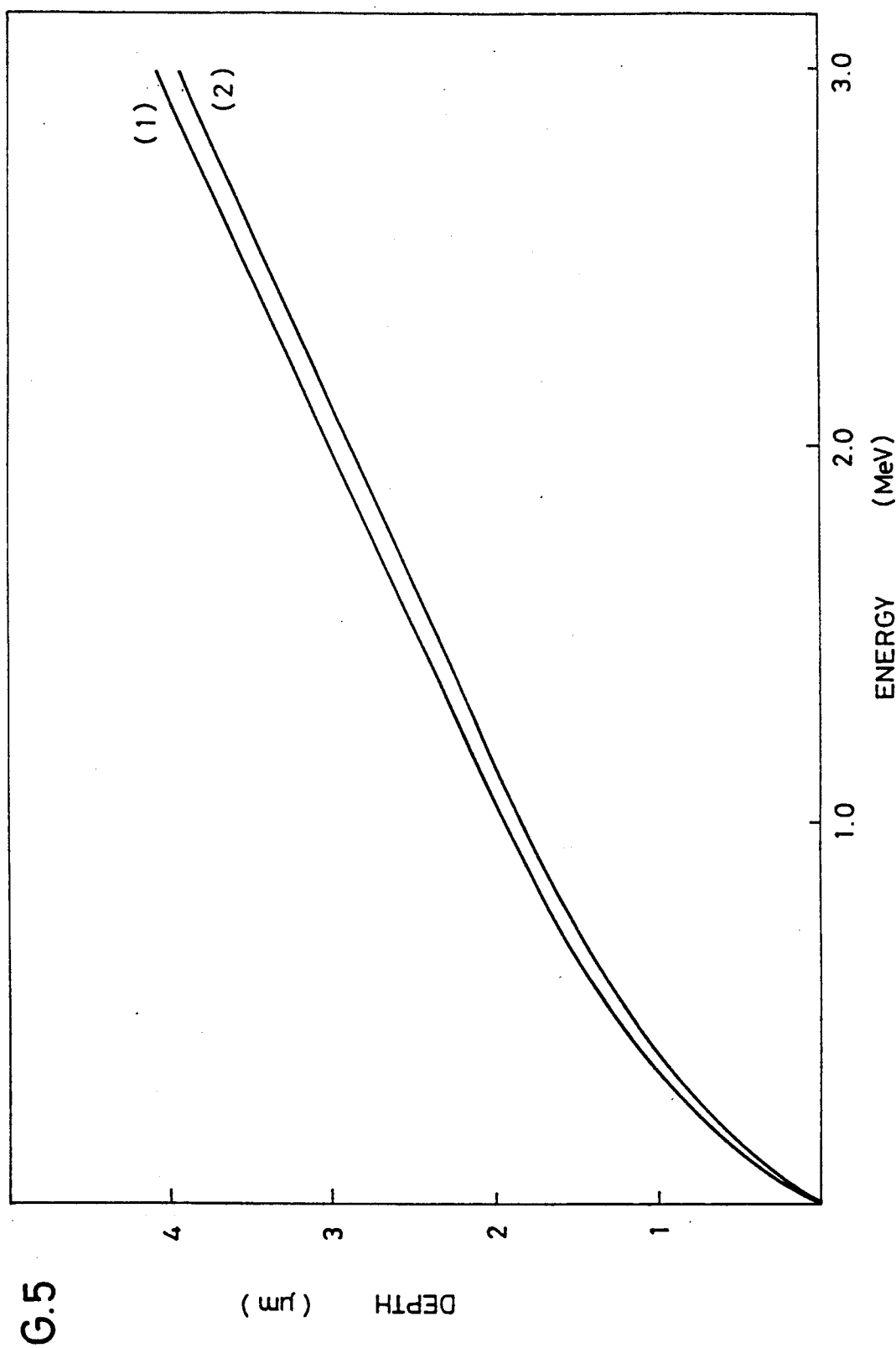
FIG. 5 shows a range of B+ ions.

Then, referring to FIG. 1D, the pattern of the resist 28 is formed on the position covering the N well region to be formed. Then the first, ion implantation of boron is made on the surface of an exposed portion for a P well on the semiconductor substrate 1 using the pattern of the resist 28 as a mask under the condition that energy is 400 keV and a dosage is $1 \times 10^{13}$ cm$^{-2}$. FIG. 5 shows the range of B+ ions. The ordinate represents the depth (μm) while the abscissa shows energy of implanting B+ ions. The curve (1) shows the range of B+ ions in SiO$_2$ while the curve (2) shows the range of B+ ions in Si. When implantation energy is selected within the range of 250∼700 keV, impurities are implanted also in a lower region 29 of the isolation oxide film 7 because the ions pass through the thick isolation oxide film 7a. Continuously, second ion implantation is made at the same position using the same mask (resist 28) under the condition that energy is 100 keV and a dosage is $1 \times 10^{12}$ cm$^{-2}$. Low energy with which ions passing through the isolation oxide film 7a are captured in the isolation oxide film 7a may be enough for the energy for performing the second ion implantation, but it is not limited to this. A P well region 6 is formed on the semiconductor substrate 1 by the ion implantation made twice.

Figure 2A:
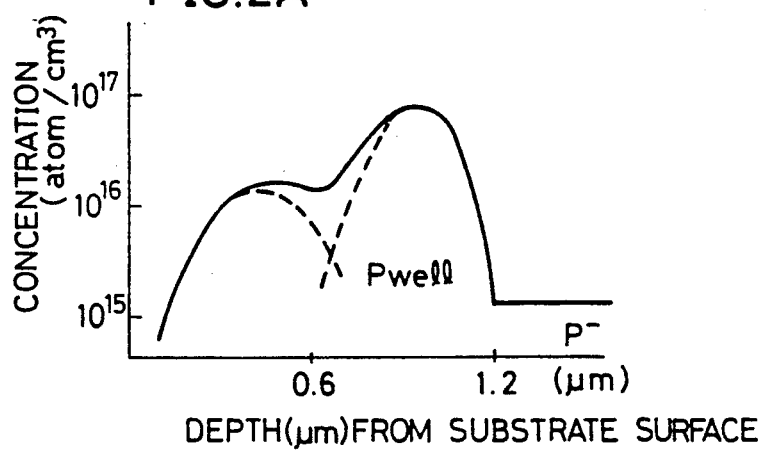
FIGS. 2A to 2C are views showing the concentration distribution of impurities at a P well region formed by the present invention.

FIG. 2A shows the concentration distribution of the formed P well region 6. Referring to FIG. 2A, the depth of the P well 6 is approximately 1.2 μm. It can be seen that the concentration of impurities at the bottom portion of the P well 6 is denser. The fact that the concentration of impurities is thicker at the bottom portion of the P well 6 means that the concentration of impurities at a lower region 29 of the isolation oxide film 7a also becomes thicker. More specifically, the lower region 29 of the isolation oxide film 7a becomes an isolation portion (that is, a channel stopper region) for preventing the latch-up.

Figure 2B:
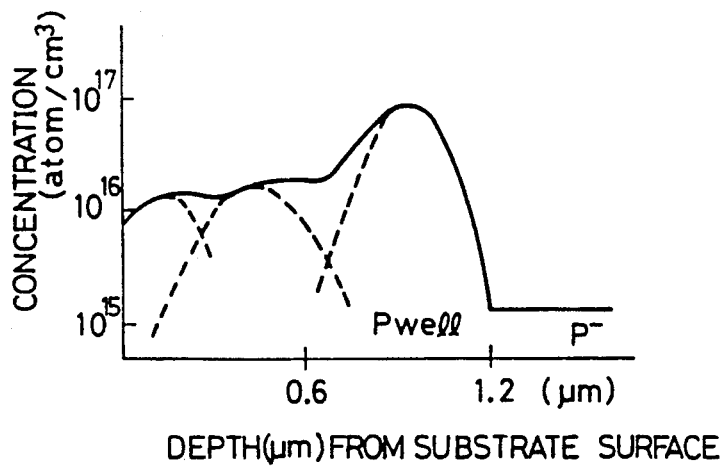

Thereafter, ion implantation of boron is made using the same mask (resist 28) at the same position, under the condition that energy is 50 keV and a dosage is $2.5 \times 10^{12}$ cm$^{-2}$. Boron is implanted in the channel region 13 of the transistor by this ion implantation. The boron implanted in the channel region 13 serves to prevent the punch through of the transistor and also adjust the threshold voltage. FIG. 2B shows the concentration distribution of the thus formed P well region. Referring to FIG. 2B, it is seen that ions are implanted in the channel region (Depth from substrate surface is about 0.1 μm) also.

Figure 2C:
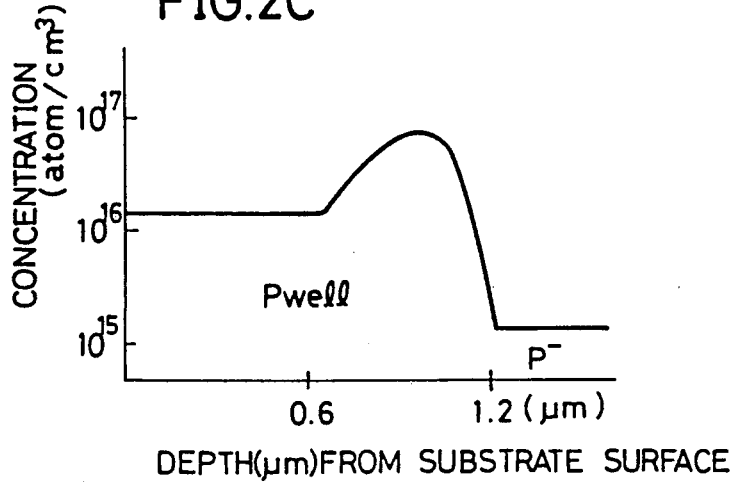
Figure 6:
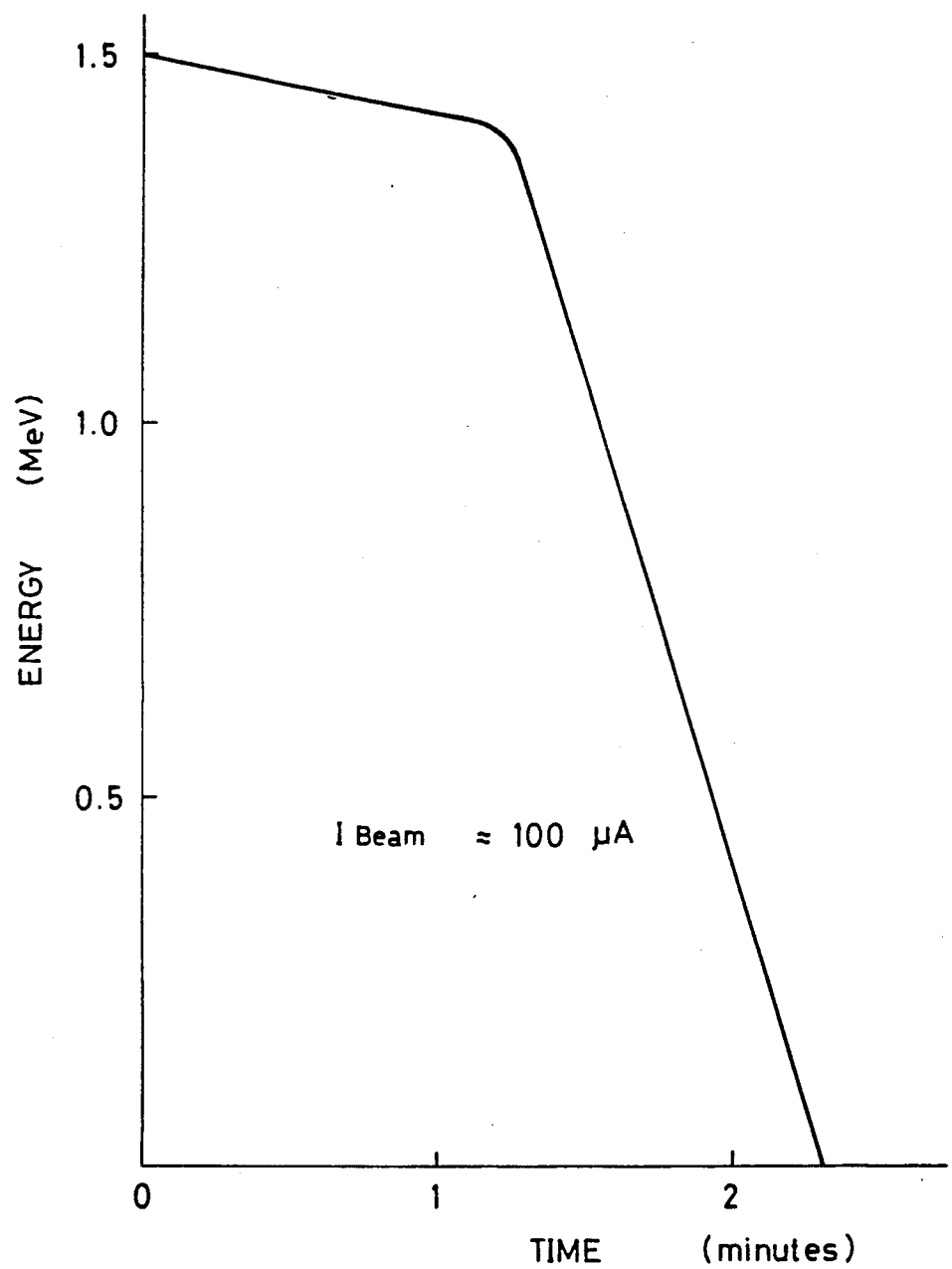
FIG. 6 shows conditions for realizing the state shown in FIG. 2C.

A P well showing uniform concentration distribution is formed as shown in FIG. 2C, by continuously increasing or decreasing energy between 700 keV and 50 keV. The time for manufacturing can be also reduced by this method. FIG. 6 shows conditions for realizing the state of FIG. 2C (relation between the time and the energy of implanting B+ ions). As is apparent from the figure, the state of FIG. 2C can be realized in about 2 minutes.

Figure 1E:
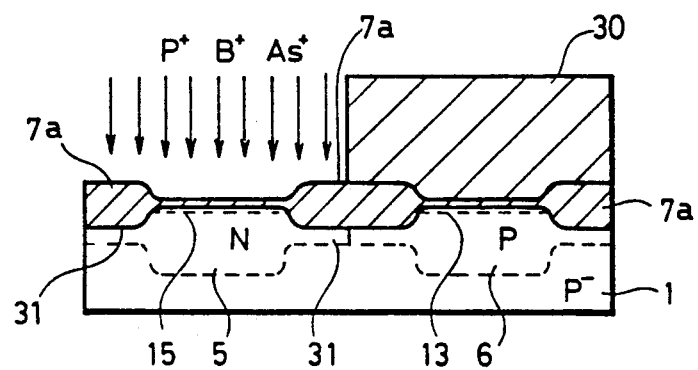
Figure 3A:
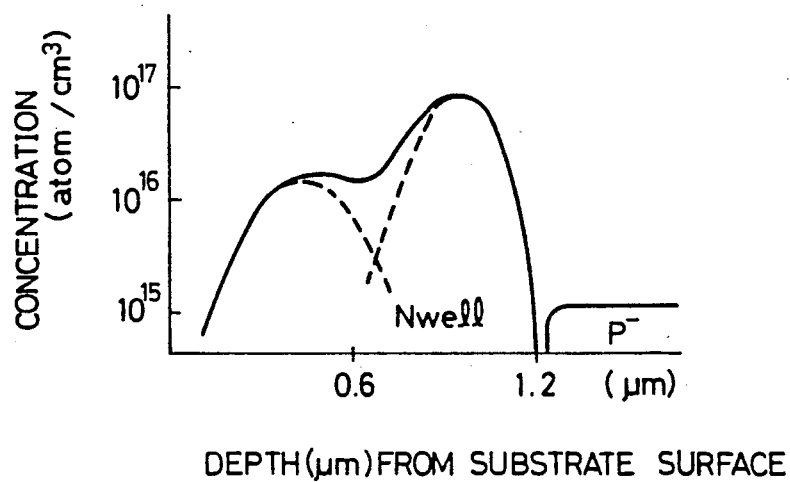
FIGS. 3A to 3C are views showing the concentration distribution of impurities of an N well region formed by the present invention.
Figure 3B:
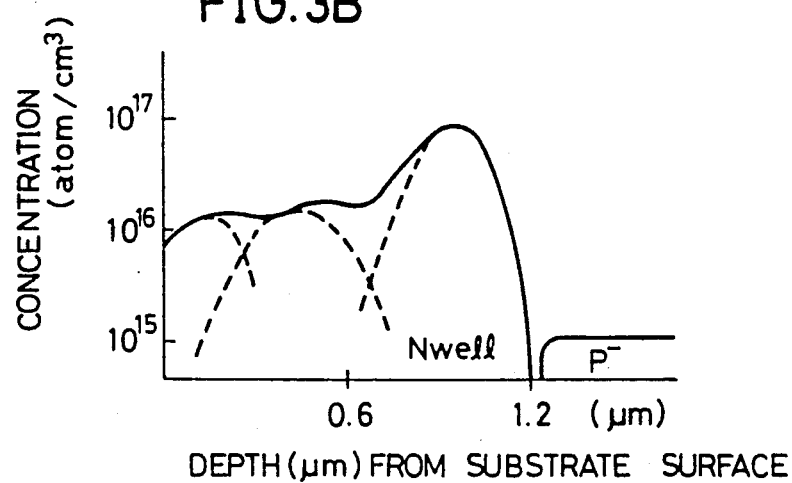
Figure 7:
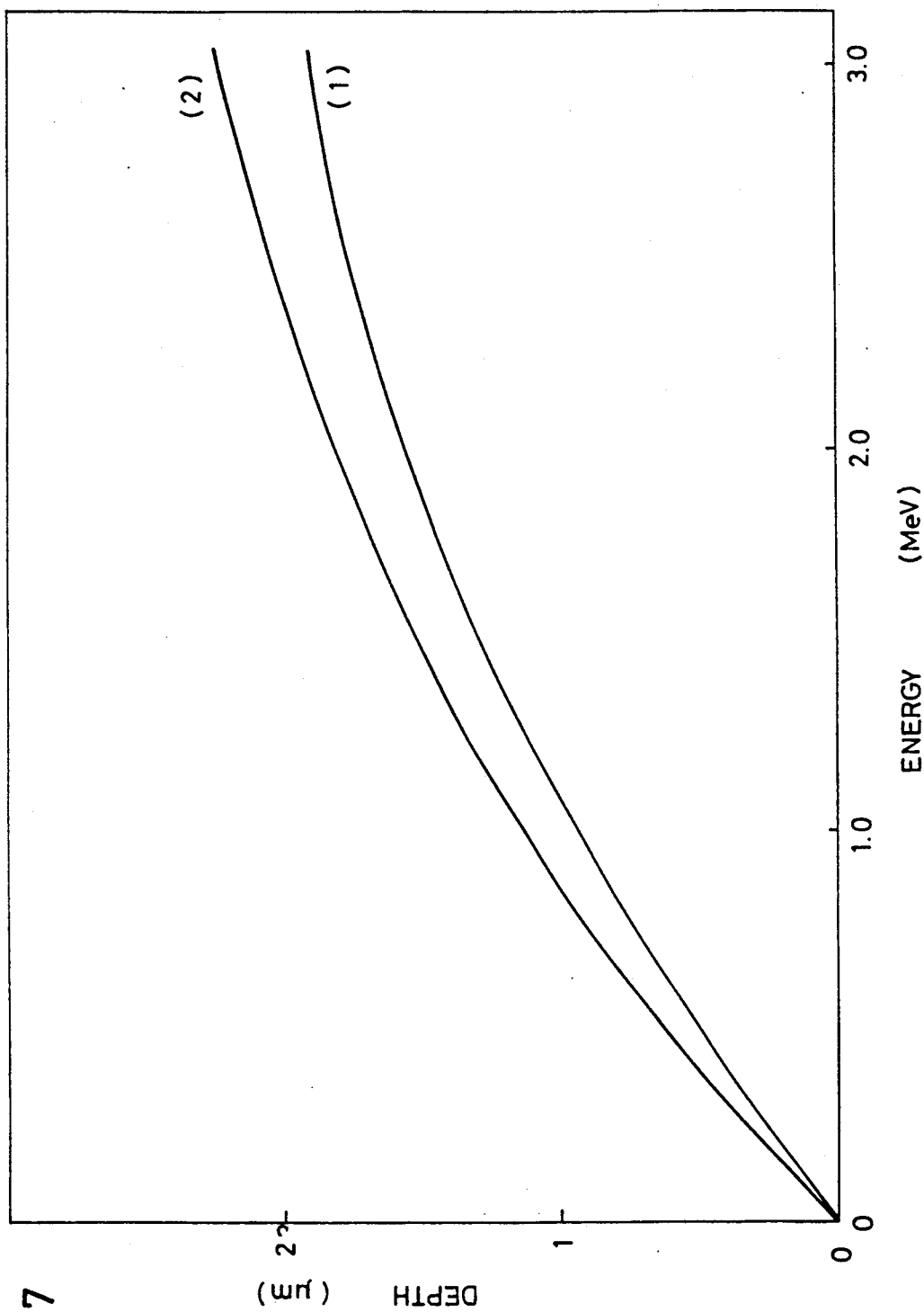
FIG. 7 shows a range of P+ ions.

Then, after the pattern of the resist 28 is removed, the pattern of the resist 30 is formed at the position covering the P well region 6 in reference to FIG. 1E. Then, the first ion implantation of phosphorus is made on the main surface of the portion in which a N well is to be formed on the exposed semiconductor substrate 1 under the condition that energy is 700 keV and a dosage is $1 \times 10^{13}$ cm$^{-2}$ using the pattern of the resist 30 as a mask. FIG. 7 shows the range of P+ ions. The ordinate represents the depth (μm) while the abscissa shows the energy of implanting P+ ions. The curve (1) shows the range of the P+ ions in SiO$_2$ while the curve (2) shows the range P+ ions in Si. When the implantation energy is selected within the range of 300∼1200 keV, ions of phosphorus are also implanted in the lower region 31 of the isolation oxide film 7a through the isolation oxide film 7a. Then, second ion implantation of phosphorous is made using the same mask (resist 30) at the same position under the condition that energy is 1200 keV and a dosage is $1 \times 10^{12}$ cm$^{-2}$. An N well region 5 is formed on the semiconductor substrate 1 by these two ion implantations. FIG. 3A shows the concentration distribution of the N well region 5. Referring to FIG. 3A, the depth of the N well 5 is approximately 1.2 μm. It is clear that the impurity concentration is greater at the bottom portion of the N well 5. Then, using the same mask (resist 30), ion implantation of boron is made at the same position under the condition that energy is 20 keV and a dosage is $2.5 \times 10^{12}$ cm$^{-2}$ and at the same time, ion implantation of arsenic is made under the condition that energy is 180 keV and a dosage is $1.5 \times 10^{12}$ cm$^{-2}$. Ions are implanted in the channel region 15 of the transistor by this ion implantation. Boron and arsenic implanted in the channel region 15 serve to prevent the punch through of the transistor and also to adjust a threshold voltage. In addition, boron is used together in order to balance the threshold voltages of both the respective transistors formed on the P well 6 and the N well 5. FIG. 3B shows the concentration distribution of the N well region formed last. Referring to FIG. 3B, it can be seen that ions are also implanted in the channel region.

Figure 3C:
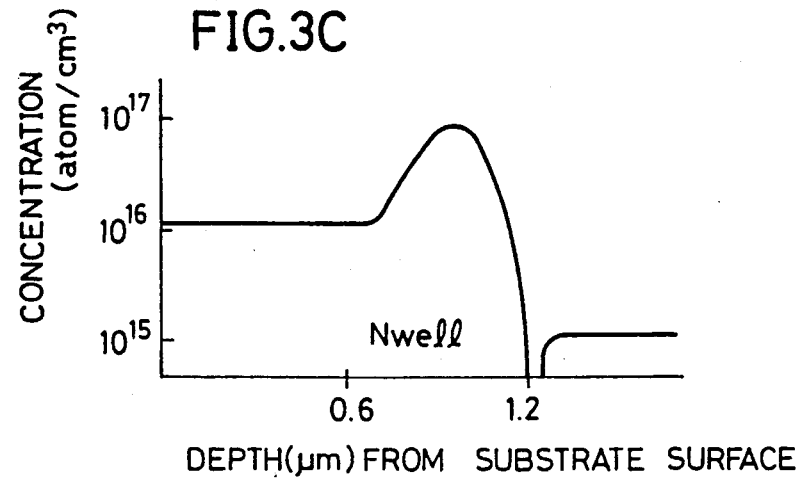
Figure 8:
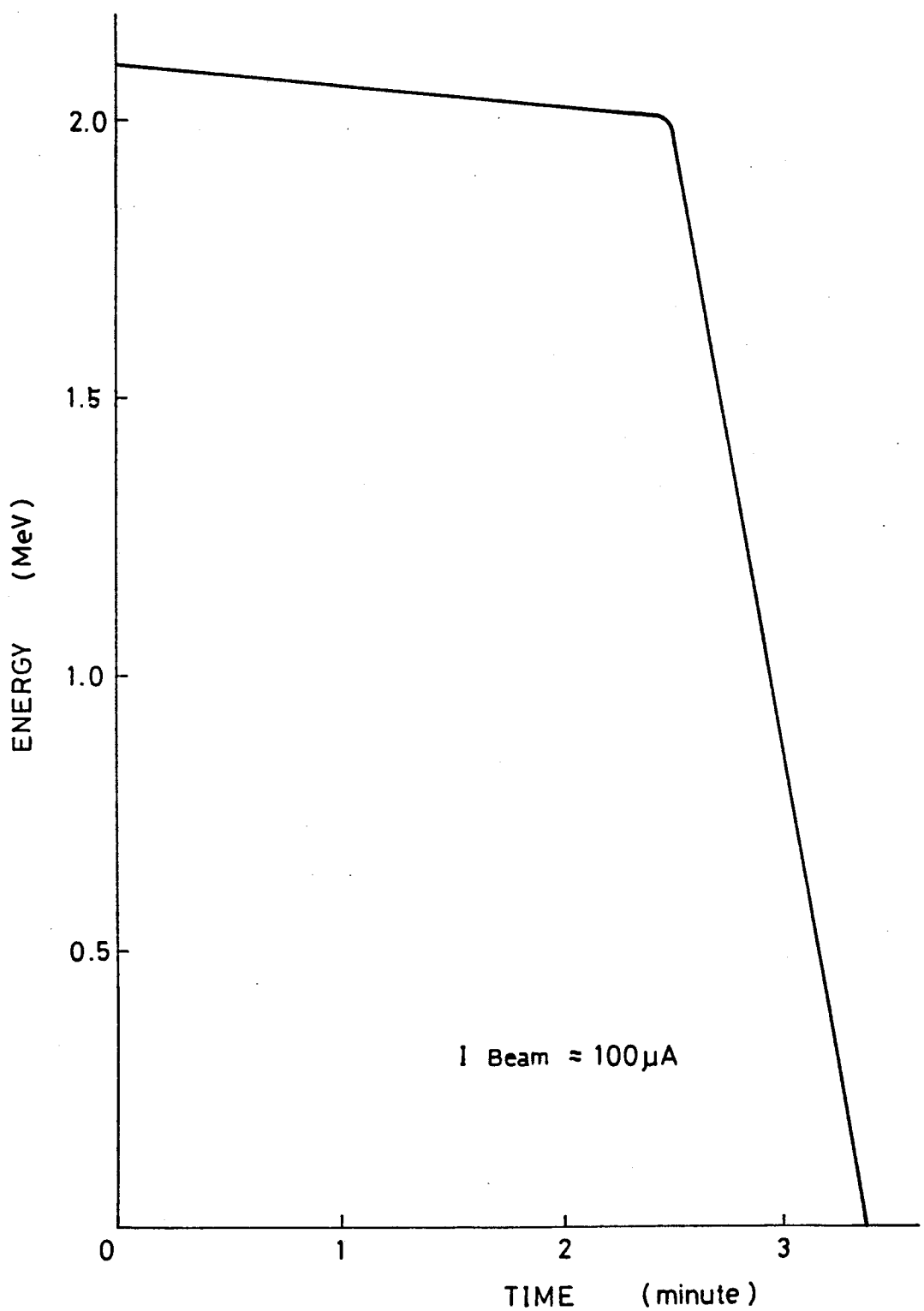
FIG. 8 shows conditions for realizing the state shown in FIG. 3C.
Figure 9A:
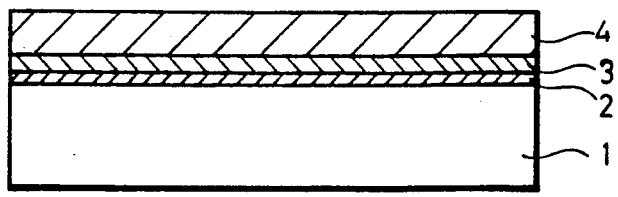
FIGS. 9A to 9T are sectional views showing conventional manufacturing steps of a CMOSFET.
Figure 9B:
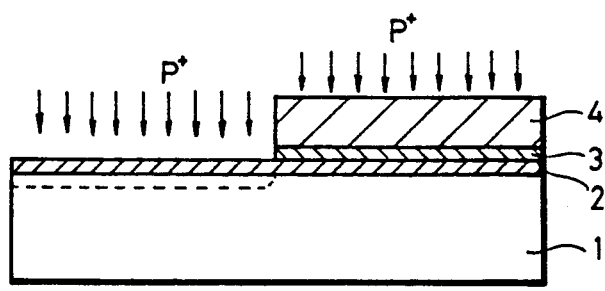
Figure 9C:
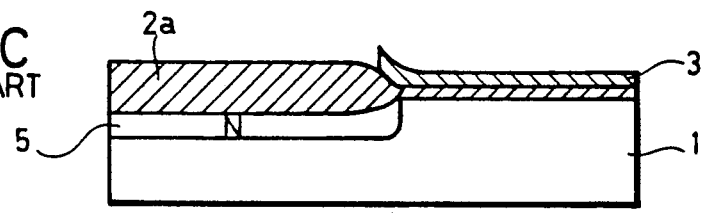
Figure 9D:
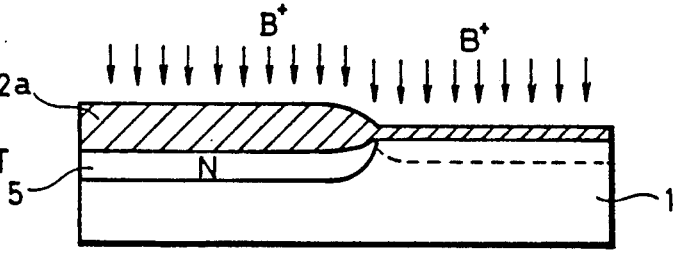
Figure 9E:
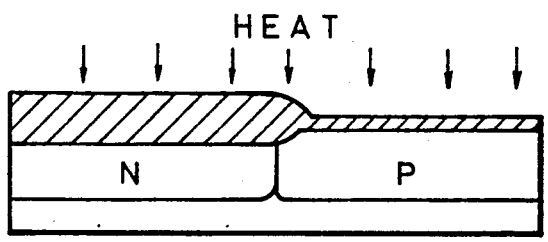
Figure 9F:
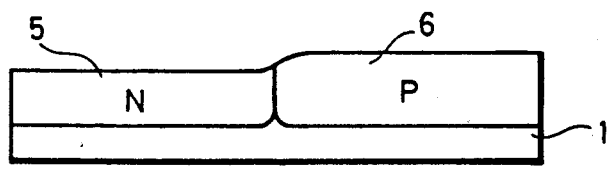
Figure 9G:
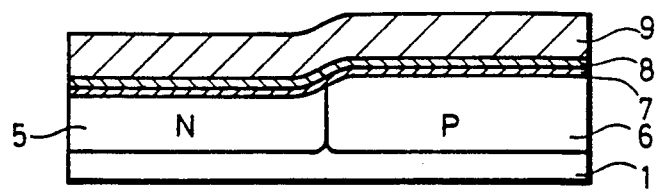
Figure 9H:
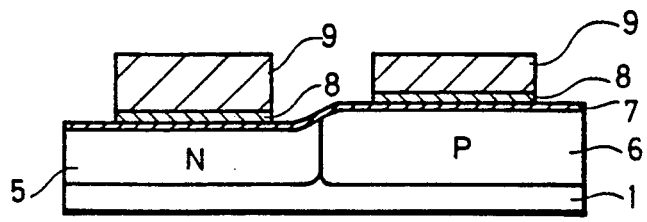
Figure 9I:
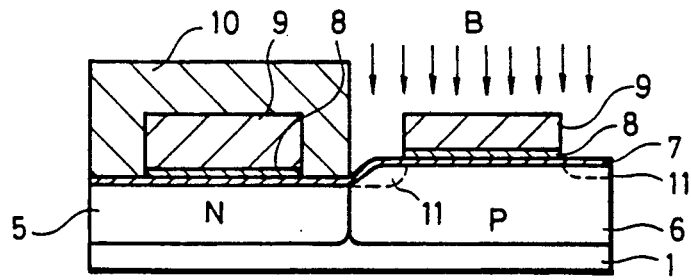
Figure 9J:
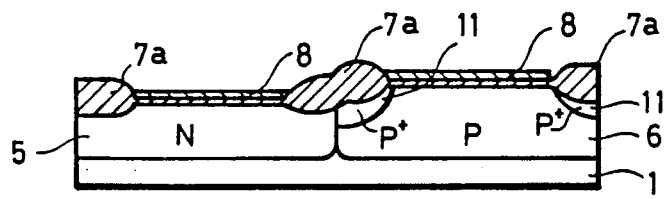
Figure 9K:
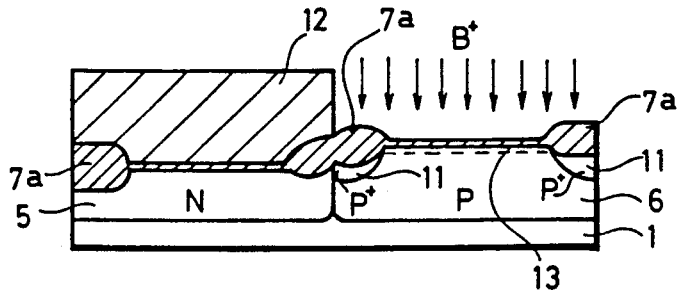
Figure 9L:
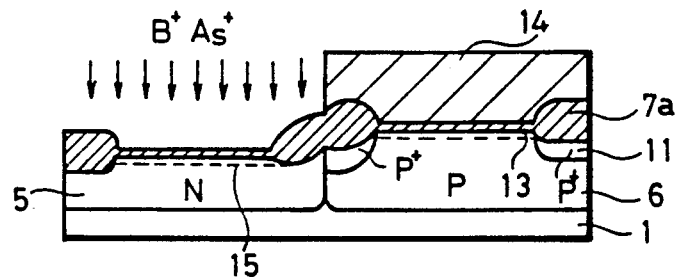
Figure 9M:
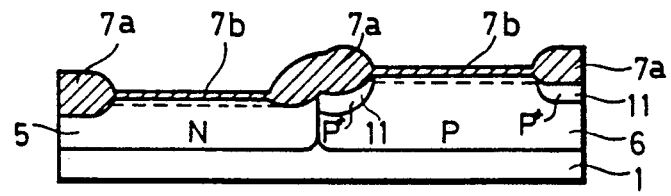
Figure 9N:
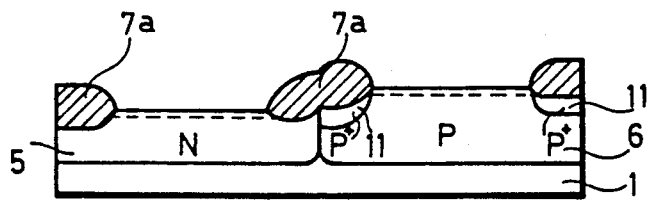
Figure 9O:
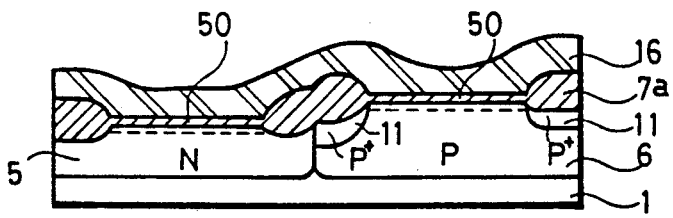
Figure 9P:
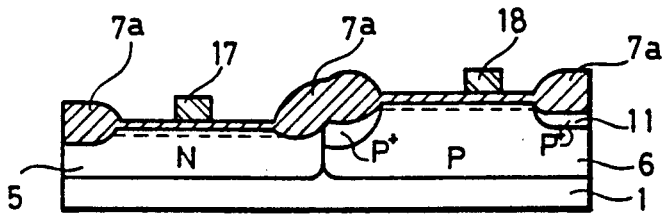
Figure 9Q:
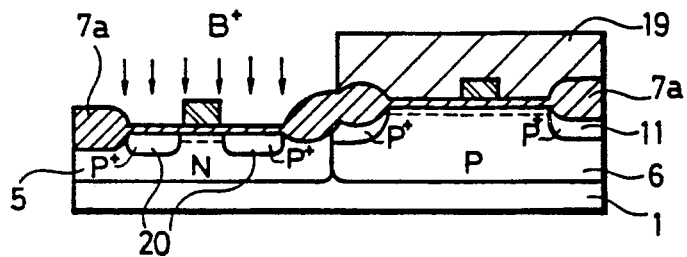
Figure 9R:
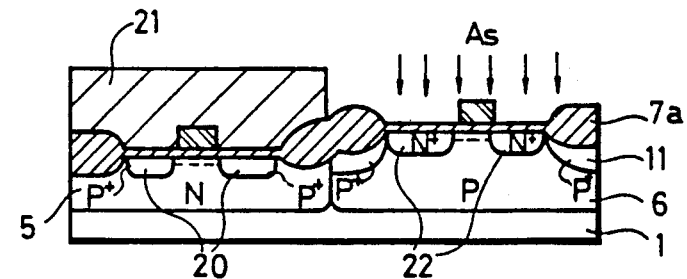
Figure 9S:
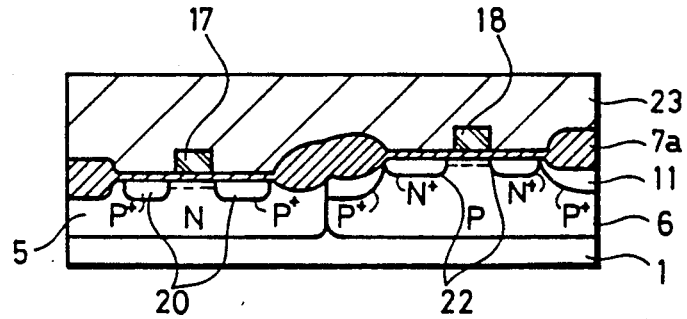
Figure 9T:
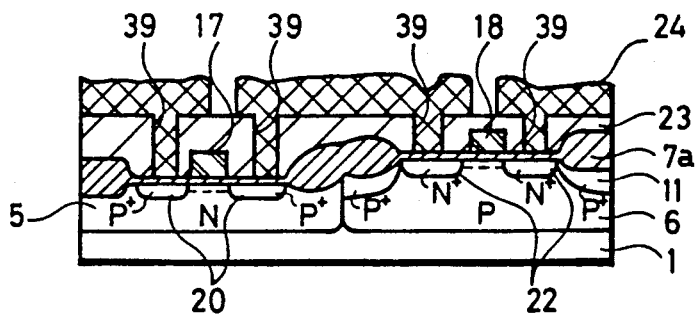
Figure 10:
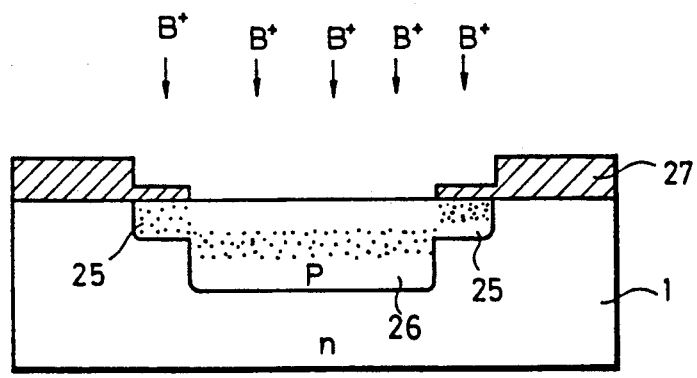
FIG. 10 is a sectional view showing another embodiment of a well forming method.

An N well showing the concentration distribution shown in FIG. 3C is formed by continuously increasing or decreasing the energy between 700 keV and 20 keV. FIG. 8 shows conditions for realizing the state shown in FIG. 3C (relation between the time and the energy implanting P+ ions). As is apparent from the figure, the state shown in FIG. 3C can be realized in about 3 minutes.

Figure 1F:
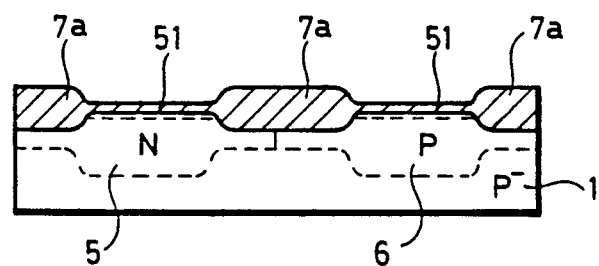

Then, referring to FIG. 1F, the pattern of the resist 30 is removed. Then, referring to FIG. 1G, a thin oxide film 51 on the active region is removed. Thereafter, a CMOSFET is formed through the conventional steps shown in FIGS. 9N to 9S.

Although a description was given of the embodiments using specific values as described above, the present invention is not limited to this. A preferable condition is shown in table 1. In that table 1, the embodiment 1 is a preferable condition when the film thickness of the isolation oxide film (7a) is 5000 Å and the embodiment 2 is a preferable condition when the film thickness of the isolation oxide film is 6000 Å.

sion of impurities is not necessary. Therefore, time required for the heat diffusion can be shortened.

Also, since ions of impurities of the same conductivity type as the impurity ions for forming the well are implanted in the channel region, the punch through of the transistor can be prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device including a P well and an N well formed adjacent

TABLE 1

| Film thickness (Å) of isolation oxide film | Energy (KeV) of ion implantation for forming P well | | Energy (KeV) of ion implantation for forming N well | | Energy (KeV) of channel ion implantation | |
|---|---|---|---|---|---|---|
| | 1st time[1] | 2nd time[2] | 1st time[3] | 2nd time[4] | P well[5] | N well[6] |
| Example 1 | 5000 | 200-700 | 10-250 | 300-1200 | 100-500 | 10-80 | 50-220 |
| Example 2 | 6000 | 250-900 | 10-300 | 400-1500 | 50-600 | 10-80 | 50-220 |

Figure 1G:
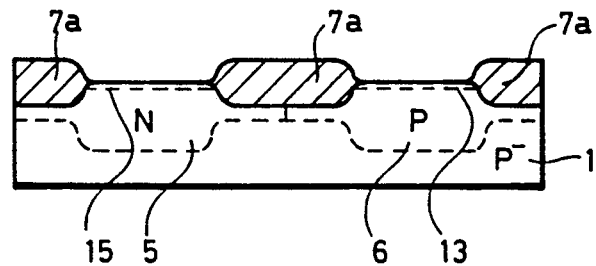

[1] Kind of ions $B^-$, Concentration $1 \times 10^{13} \, cm^{-2}$
[2] Kind of ions $B^+$, Concentration $1 \times 10^{12} \, cm^{-2}$
[3] Kind of ions $P^-$, Concentration $1 \times 10^{13} \, cm^{-2}$
[4] Kind of ions $P^-$, Concentration $1 \times 10^{12} \, cm^{-2}$
[5] Kind of ions $B^-$, Concentration $2.5 \times 10^{12} \, cm^{-2}$
[6] Kind of ions $As^-$, Concentration $1.5 \times 10^{12} \, cm^{-2}$ In this embodiment, referring to FIGS. 1B, 1D and 1E, photolithography processes are performed three times before the state shown in FIG. 1G (corresponding to FIG. 5M) is implemented. Therefore, the number of the photolithography processes is reduced by two as compared with the prior art.

In addition, although heat treatment for 6~8 hours was necessary for impurity ions to diffuse in forming the well in the prior art, such heat treatment is not necessary in the present invention. Therefore, manufacturing time is shortened.

Figure 4:
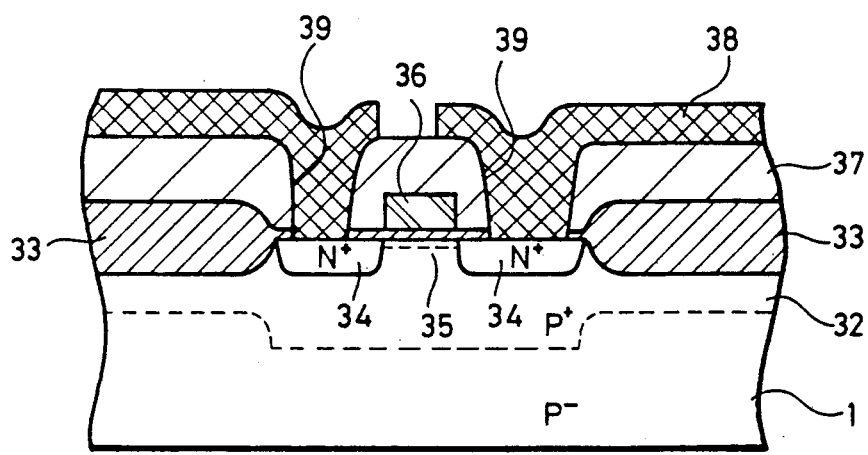
FIG. 4 is a sectional view of another semiconductor device to which the present invention is applied.

FIG. 4 is a sectional view of another semiconductor device to which the present invention is applied. The semiconductor device shown in FIG. 4 has a well of a single conductivity type. Referring to FIG. 4, a p+ layer 30 is formed on the main surface of a semiconductor substrate 1 (for example, a p− silicon substrate). An isolation oxide film 33 is formed on the main surface of the p+ layer 32 and a transistor is isolated from another elements. The transistor comprises source/drain regions 34, a channel region 35 and a gate electrode 36 formed through a gate oxide film. An insulating film 37 is formed on the whole surface of the semiconductor substrate 1 comprising the gate electrode 36. A contact hole 39 is provided in the insulating film 37 and aluminum metal 38 for wiring is connected to the source and drain 34.

In this embodiment, ion implantation for forming p+ layer 32 and ion implantation into the channel region 35 are performed using the same mask by the same method shown in FIG. 1D.

As described above, according to the present invention, since the formation of the well and the channel ion implantation are performed using the same mask, the number of photolithography processes is decreased.

In addition, in forming the well, since impurity ions for forming the well are implanted with high energy giving the concentration distribution of impurities which becomes the maximum a the place deeper than the region for the transistor on the main surface of the well region of the semiconductor substrate, heat diffuto each other in the main surface of a semiconductor substrate, comprising the steps of:

forming an isolation oxide film for isolating a first active region and a second active region from each other in the main surface of the semiconductor substrate;

forming on said semiconductor substrate a first mask for covering said second active region and a part of said isolation oxide film and exposing said first active region and the remaining part of said isolation oxide film;

implanting P type impurity ions for the first time into the main surface of said first active region of said semiconductor substrate through the remaining part of said isolation oxide film with such a first high energy that a P type impurity layer is formed in the lower region of the remaining part of said isolation oxide film, thereby forming at the same time the bottom of the said P well and channel stoppers in the lower region of the remaining part of said isolation oxide film for preventing latch-up of said P well and N well, the concentration of said P type impurity ions implanted for the first time being selected to be such concentration that the concentration of the P type impurity ions of said channel stoppers prevents said latch up;

implanting P type impurity ions for the second time into the main surface of the first active region of said semiconductor substrate for forming a P-type well, with such a second high energy that the P-type impurity ions stay between the bottom of said P well and the main surface of said semiconductor substrate;

implanting P type impurity ions for the third time into the main surface of said first active region, using said first mask with such a first low energy that the P type impurity ions stay in the main surface of said first active region, thereby forming a punch through preventing layer in the main surface of the first active region;

removing said first resist;

forming on said semiconductor substrate a second mask for covering said first active region and the remaining part of said isolation oxide film and exposing said second active region and said part of said isolation oxide film;

implanting N type impurity ions for the first time for forming an N type well into the main surface of said second active region of said semiconductor substrate through a part of said isolation oxide film, using said second mask with such a third high energy that an N type impurity layer is formed in the lower region of said part of said isolation oxide film, thereby forming at the same time the bottom of said N well and channel stoppers in the lower region of said part of said isolation oxide film for preventing latch up of said P well and said N well, the concentration of said N type impurity ions implanted for the first time is selected to be such a necessary concentration that the concentration of the N type impurity ions of said channel stoppers prevents said latch up;

implanting N type impurity ions for the second time for forming said N well into the main surface of said second active region of said semiconductor substrate, using said second mask, with such a fourth high energy that the N type impurity ions stay between the bottom of said N well and the main surface of said semiconductor substrate;

implanting N type impurity ions for the third time into the main surface of said second active region, using said second mask with such a low energy that the N type impurity ions stay in the main surface of said second active region, thereby forming a punch through preventing layer in the main surface of said second active region; and removing said second mask.

2. A method as recited in claim 1, wherein the ion implantation with said first low energy is conducted subsequent to the ion implementation with said first high energy and the ion implantation with said second high energy.

3. A method as recited in claim 2, wherein the ion implantation with said first high energy and the ion implantation with said second high energy and the ion implantation with said first low energy are conducted continuously by continuously reducing the implantation energies.

4. A method as recited in claim 1, wherein the ion implantation with said second low energy is conducted after the ion implantations with said third and fourth high energies.

5. A method as recited in claim 4, wherein the ion implantations with said third and fourth high energies and the ion implantation with said second low energy are continuously conducted by continuously reducing the implantation energies.

6. A method as recited in claim 1, wherein said first high energy is in the range between 200 and 900 keV, said second high energy is in the range between 10 and 300 keV, and said first low energy is in the range between 10 and 80 keV.

7. A method as recited in claim 1, wherein said third high energy is in the range between 300 and 1500 keV, said fourth high energy is in the range between 50 and 600 keV, and said second low energy is in the range between 50 and 220 keV.

* * * * *